United States Patent
Wang

(10) Patent No.: US 11,132,972 B2
(45) Date of Patent: Sep. 28, 2021

(54) METHOD FOR SPREADING SPECTRUM, CHIP, DISPLAY PANEL, AND COMPUTER READABLE STORAGE MEDIUM

(71) Applicant: HKC CORPORATION LIMITED, Shenzhen (CN)

(72) Inventor: Mingliang Wang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/042,760

(22) PCT Filed: Dec. 19, 2018

(86) PCT No.: PCT/CN2018/121890
§ 371 (c)(1),
(2) Date: Sep. 28, 2020

(87) PCT Pub. No.: WO2020/113679
PCT Pub. Date: Jun. 11, 2020

(65) Prior Publication Data
US 2021/0027737 A1    Jan. 28, 2021

(30) Foreign Application Priority Data
Dec. 5, 2018 (CN) .......................... 201811484037.0

(51) Int. Cl.
*G09G 3/36* (2006.01)
*H03K 4/06* (2006.01)

(52) U.S. Cl.
CPC ....... *G09G 3/3696* (2013.01); *G09G 2310/08* (2013.01); *G09G 2330/06* (2013.01); *H03K 4/06* (2013.01)

(58) Field of Classification Search
CPC .............. G09G 2310/08; G09G 3/3611–3/367
See application file for complete search history.

(56) References Cited

U.S. PATENT DOCUMENTS

2005/0151715 A1* 7/2005 Chegal ................... G11C 19/28
345/100
2012/0063534 A1   3/2012 Lin et al.
(Continued)

FOREIGN PATENT DOCUMENTS

CN   106059683 A   10/2016
CN   107154243 A    9/2017
(Continued)

OTHER PUBLICATIONS

International Search Report and Written Opinion in corresponding PCT Application No. PCT/CN2018/121890, dated Aug. 27, 2019.

*Primary Examiner* — Roy P Rabindranath
(74) *Attorney, Agent, or Firm* — Westbridge IP LLC

(57) ABSTRACT

Disclosed is a method for spreading spectrum, which includes: acquiring a modulation signal corresponding to a clock signal, when the clock signal is detected; and spectrum spreading the clock signal according to the modulation signal, wherein the modulation signals respectively corresponding to two adjacent clock signals are opposite in phase. The present disclosure further provides a chip, a display panel, and a computer readable storage medium. The present disclosure solves the technical problem of poor spread spectrum effect on dual clock signals.

18 Claims, 2 Drawing Sheets

(56) References Cited

U.S. PATENT DOCUMENTS

2012/0306835 A1* 12/2012 Kitagawa ............. G09G 3/3648
            345/209
2018/0240422 A1*  8/2018 Omura ................. G09G 3/3655
2019/0157910 A1*  5/2019 Choi ....................... H02M 3/28

FOREIGN PATENT DOCUMENTS

| CN | 107222211 A | 9/2017 |
| CN | 109345996 A | 2/2019 |

\* cited by examiner

METHOD FOR SPREADING SPECTRUM, CHIP, DISPLAY PANEL, AND COMPUTER READABLE STORAGE MEDIUM

CROSS-REFERENCE TO RELATED APPLICATIONS

The present disclosure is the National Stage of International Application No. PCT/CN2018/121890, filed on Dec. 19, 2018, which claims the priority of Chinese Application No. 201811484037.0, entitled "METHOD FOR SPREADING SPECTRUM, CHIP, DISPLAY PANEL, AND READABLE STORAGE MEDIUM", filed on Dec. 5, 2018, which is hereby incorporated by reference in its entirety.

TECHNICAL FIELD

The present disclosure relates to the technical field of communication, in particular to a method for spreading spectrum, a chip, a display panel, and a computer readable storage medium.

BACKGROUND

Liquid Crystal Display (LCD) panels with a larger size, a higher resolution, and a higher frame rate, has become increasingly popularized with the improvement of domestic lives. Signals is output by the driving board of LCD panel through Timing Controller (TCON), and transmitted to the data driver and the gate driver, to control the LCD panel to display. Nowadays, as the rise of the display definition, the displaying data of the LCD panel increases. When TCON receives the display data from a front-end system, the spread spectrum module divides the clock signal contained in the display data into two clock signals and output, to ensure that valid data can be transmitted within a limited time. And the clock signal output by TCON are usually spectrum spread, given to the strict Electromagnetic Radiation (EMI) requirement by the government.

At present, two clock signals are spectrum spread with a same center-spreading by a same modulation signal. As such, the energy concentration positions of the two spread clock signals are the same, which cannot be widely dispersed. Meanwhile, in order to ensure normal data transmission, the energy cannot be spread and dispersed too wide, otherwise the spread may be too poor to meet the EMI specifications.

SUMMARY

It is therefore one main objective of the disclosure to provide a method for spreading spectrum, a chip, a display panel, and a computer readable storage medium, arming to solve the technical problems that it is hard to calculate the real-time congestion index, and describe the real-time congestion degree of the whole network cable quantitatively.

In order to achieve the above objective, the present disclosure provides a method for spreading spectrum, which includes the following operations:

acquiring a modulation signal corresponding to a clock signal, when the clock signal is detected; and spectrum spreading the clock signal according to the modulation signal, wherein the modulation signals respectively corresponding to two adjacent clock signals are opposite in phase.

Optionally, prior to the operation of acquiring the modulation signal corresponding to the clock signal, when the clock signal is detected, the method further includes:

inputting a first modulation signal into an inverter to generate a second modulation signal; and defining the first modulation signal and the second modulation signal as the modulation signal for each respective clock signal.

Optionally, prior to the operation of inputting the first modulation signal into the inverter to generate the second modulation signal, the method further includes:

acquiring and taking an output signal of a signal generator as the first modulation signal.

Optionally, the first modulation signal is a triangular wave signal and the signal generator is a triangular wave generator.

Optionally, the operation of spreading the clock signal according to the modulation signal includes:

acquiring a voltage controlled oscillator corresponding to the modulation signal; and controlling the voltage controlled oscillator to spectrum spread the clock signal through the modulation signal.

Optionally, prior to the operation of spectrum spreading the clock signal according to the modulation signal, the method further includes:

acquiring displaying data, and obtaining a display clock signal according to the displaying data; and generating the two adjacent clock signals according to the display clock signal.

Optionally, after the operation of spectrum spreading the clock signal according to the modulation signal, the method further includes:

outputting the spectrum spread two adjacent clock signals.

In addition, in order to achieve the above objective, the present disclosure also provides a chip, which includes: a signal generator, a voltage controlled oscillator, an inverter, a memory, a processor, and a spread spectrum program stored on the memory and executable on the processor. The spread spectrum program when executed by the processor performs the operations of the method for spreading spectrum.

In addition, in order to achieve the above objective, the present disclosure further provides a display panel which includes a chip, the chip includes: a signal generator, a voltage controlled oscillator, an inverter, a memory, a processor, and a spread spectrum program stored on the memory and executable on the processor. The spread spectrum program when executed by the processor performs the operations of the method for spreading spectrum.

In addition, in order to achieve the above objective, the present disclosure further provides a computer readable storage medium. The computer readable storage medium stores a spread spectrum program, the spread spectrum program when executed by the processor performs the operations of the method for spreading spectrum.

The present disclosure provides the method for spreading spectrum, the chip, the display panel, and the computer readable storage medium. When the clock signal is detected, the modulation signal corresponding to the clock signal is obtained, and then the clock signal is spectrum spread according to the modulation signal, and the modulation signals respectively corresponding to two adjacent clock signals are opposite in phase. As the present disclosure adopts two modulation signals which are opposite in phase to control two independent voltage controlled oscillators, for spectrum spreading the two adjacent clock signals reversely, so that the spread spectrum range of the clock signals is increased, while the distortion degree of the signals is unchanged, thus further controlling the electromagnetic interference generated by the clock signals.

The realizing of the arm, functional characteristics, advantages of the present disclosure are further described in detail with reference to the accompanying drawings and the embodiments.

DETAILED DESCRIPTION OF EMBODIMENTS

It is to be understood that the exemplary embodiments of the present disclosure are used for illustrating the present disclosure rather than restricting the present disclosure.

The main solution of the exemplary embodiment of the present disclosure includes:

acquiring a modulation signal corresponding to a clock signal, when the clock signal is detected; and spectrum spreading the clock signal according to the modulation signal, wherein the modulation signals respectively corresponding to two adjacent clock signals are opposite in phase.

At present, two clock signals can be spectrum spread from a same center through one same modulation signal, as such the two spread clock signals have the same energy concentration position, which causing the two energies are not widely dispersed. Meanwhile, in order to ensure normal data transmission, the energy cannot be spread and dispersed too wide, or the spectrum spread effect is too poor to meet the EMI specifications.

The exemplary embodiment of the present disclosure provides a method for spreading spectrum, a chip, a display panel, and a computer readable storage medium. When the clock signal is detected, the modulation signal corresponding to the clock signal is obtained, and then the clock signal is spectrum spread according to the modulation signal, and the modulation signals respectively corresponding to two adjacent clock signals are opposite in phase. As the present disclosure adopts two modulation signals which are opposite in phase to control two independent voltage controlled oscillators, for spectrum spreading the two adjacent clock signals reversely, so that the spread spectrum range of the clock signals is increased, while the distortion degree of the signals is unchanged, thus further controlling the electromagnetic interference generated by the clock signals.

Figure 1:
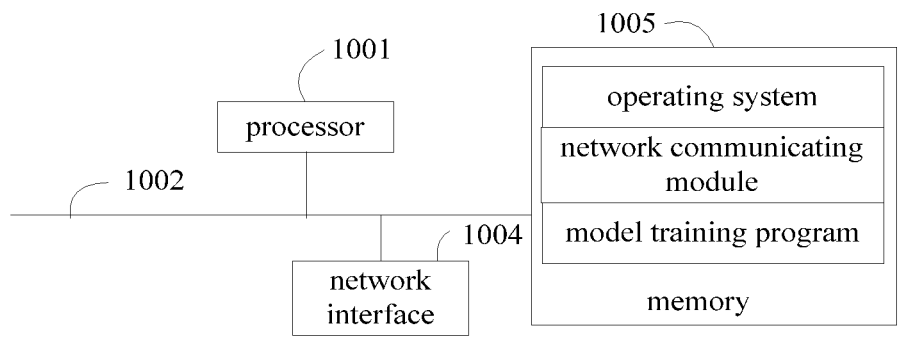
FIG. 1 is a terminal structure diagram of a hardware operating environment according to some exemplary embodiments of the present disclosure.

Referring to FIG. 1, FIG. 1 is a terminal structure diagram of a hardware operating environment according to an exemplary embodiment of the present disclosure.

The terminal according to an exemplary embodiment of the present disclosure can be a timing controller of a liquid crystal display panel.

As shown in FIG. 1, the terminal may include a processor 1001, such as a microprocessor unit, a network interface 1004, a memory 1005, and a communication bus 1002. The communication bus 1002 is configured to realize connections and communications among these components. The network interface 1004 may optionally include a standard wired interface and a wireless interface (such as a WI-FI interface). The memory 1005 may be a high-speed Random Access Memory (RAM) memory or a non-volatile memory such as a disk memory. The memory 1005 may alternatively be a storage device independent of the aforementioned processor 1001.

In addition, the timing controller of the liquid crystal display panel may include a signal generator, two voltage controlled oscillators, and a reverse processing unit, and the signal generator may be a triangular wave generator, and the reverse processing unit may be an inverter.

Those skilled in the art can understand that the terminal structure shown in FIG. 1 does not constitute a limitation on the terminal, and the terminal may include more or fewer components than shown, or a combination of some of the components, or different component arrangements.

As shown in FIG. 1, the memory 1005 as a computer storage medium may include an operating system, a network communication module, and a spread spectrum program.

In the terminal shown in FIG. 1, the network interface 1004 is mainly configured to connect with a back-end server and perform data communication with the back-end server. The user interface 1003 is mainly configured to connect to a client (such as a user end) and perform data communication with the client. While the processor 1001 may be configured to call the spread spectrum program stored in the memory 1005 and perform the following operations:

acquiring a modulation signal corresponding to a clock signal, when the clock signal is detected; and spectrum spreading the clock signal according to the modulation signal, wherein the modulation signals respectively corresponding to two adjacent clock signals are opposite in phase.

Optionally, the processor 1001 may call the spread spectrum program stored in the memory 1005 and also perform the following operations:

acquiring a statistical rule of inbound and outbound, and current inbound and outbound data; and calculating a trip track according to the statistical rule and the current inbound and outbound data.

Optionally, the processor 1001 may call the spread spectrum program stored in the memory 1005 and perform the following operations:

inputting a first modulation signal into an inverter to generate a second modulation signal; and defining the first modulation signal and the second modulation signal as the modulation signal for each respective clock signal.

Optionally, the processor 1001 may call the spread spectrum program stored in the memory 1005 and perform the following operations:

acquiring and taking an output signal of a signal generator as the first modulation signal.

Optionally, the processor 1001 may call the spread spectrum program stored in the memory 1005 and perform the following operations:

acquiring a voltage controlled oscillator corresponding to the modulation signal; and controlling the voltage controlled oscillator to spectrum spread the clock signal through the modulation signal.

Optionally, the processor 1001 may call the spread spectrum program stored in the memory 1005 and perform the following operations:

acquiring displaying data, and obtaining a display clock signal according to the data; and generating the two adjacent clock signals according to the display clock signal.

Optionally, the processor 1001 may call the spread spectrum program stored in the memory 1005 and perform the following operations:

outputting the spectrum spread two adjacent clock signals.

Figure 2:
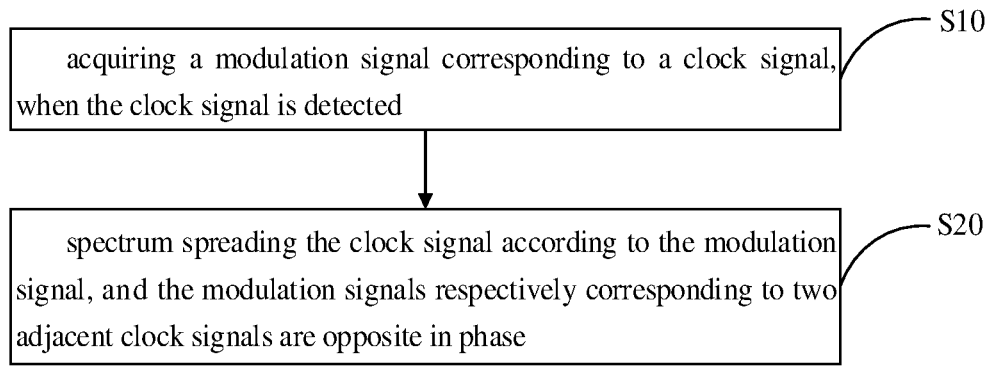
FIG. 2 is a flow chart of a method for spreading spectrum according to first exemplary embodiments of the present disclosure.

Referring to FIG. 2, the method for spreading spectrum according to a first exemplary embodiment of the present disclosure includes:

Step S10, acquiring a modulation signal corresponding to a clock signal, when the clock signal is detected.

In some exemplary embodiments, the liquid crystal display panel outputs signals to the data driving chip and the gate driving chip through TCON, as such the data driving chip and the gate driving chip can enable the panel to display according to the output signals. The data carried in the output signal is getting larger and larger due to the clarity improvement. The clock signal carried in the received data is divided into two identical clock signals, then the data driving chip and the gate driving chip are controlled to enable the panel to display according to the two clock signals, respectively. Since the two clock signals are identical, Electromagnetic Radiation (EMT) may be increased. In order to meet the requirements of the electromagnetic radiation standard, the two clock signals need to be subjected to the spread spectrum modulation.

Optionally, before step S10, the method further includes:

S30, inputting a first modulation signal into an inverter to generate a second modulation signal; and S40, defining the first modulation signal and the second modulation signal as the modulation signal for each respective clock signal.

In some exemplary embodiments, the first modulation signal is regarded as the output signal of the signal generator, then the output signal of the signal generator is input to the inverter, and the output signal of the inverter is taken as the second modulation signal. The first clock signal is spread upwards according to the first modulation signal, and the second clock signal is spread downwards according to the second modulation signal. Alternatively, the first clock signal is spread upwards according to the first modulation signal and the second clock signal is spread upwards according to the second modulation signal.

Optionally, before step S30, the method further includes:

S50, acquiring and taking an output signal of a signal generator as the first modulation signal.

The timing controller is provided with a signal generator, and the signal generator may be a triangular wave generator. The output signal of the signal generator is acquired as the first modulation signal.

Further, before S20, the method further includes:

S60, acquiring displaying data, and obtaining a display clock signal according to the data; and S70, generating the two adjacent clock signals according to the display clock signal.

In some exemplary embodiments, TCON receives displaying data sent by the front-end system, and determines a corresponding clock signal according to the displaying data, and then TCON could process the clock signal. That is, TCON divides the clock signal into two adjacent clock signals (i.e., two identical clock signals).

When TCON divides the clock signal into two adjacent clock signals (i.e., two identical clock signals), the two adjacent clock signals are respectively input into two different voltage controlled oscillators, and the voltage controlled oscillators are controlled to perform spread-spectrum modulation on the clock signals according to two modulation signals which are opposite in phrase.

Specifically, when TCON divides the clock signal into two adjacent clock signals, the modulation signals which respectively correspond to the two adjacent clock signals are obtained. When it needs to acquire the modulation signal corresponding to the first clock signal, the output signal of the signal generator can be directly defined as the modulation signal corresponding to the first clock signal. When it needs to acquire the modulation signal corresponding to the second clock signal, the output signal of the signal generator can be input into the inverter, and the output signal of the inverter is defined as the modulation signal corresponding to the second clock signal. When it is conducted to modulate the clock signals, the first clock signal may be spread upwards and the second clock signal may be spread downwards, as such the energies of the two clock signals are more dispersed, thereby reducing EMT generated by the two adjacent clock signals.

The first modulation signal is set to modulate the first clock signal, that is, the first modulation signal is taken as the excitation signal of the voltage controlled oscillator, to control the voltage controlled oscillator to spread the spectrum of the first clock signal.

The operation S20 includes: spreading the clock signal according to the modulation signal, and the modulation signals respectively corresponding to two adjacent clock signals are opposite in phase.

In some exemplary embodiments, the clock signal is spread according to the modulation signal, in detail, the clock signal is subjected to the spread spectrum modulation according to the modulation signal. The clock signal is divided into two adjacent clock signals (i.e., two identical clock signals), in order to further reduce the electromagnetic radiation generated by two adjacent clock signals, the two adjacent clock signals are modulated using two modulation signals which are opposite in phrase.

Optionally, the operation S20 includes:

S21, acquiring a voltage controlled oscillator corresponding to the modulation signal.

In some exemplary embodiments, TCON may includes a first voltage controlled oscillators and a second voltage controlled oscillator which are independent of each other. After determining the modulation signals, the voltage controlled oscillators corresponding to the modulation signals are obtained, respectively. The first modulation signal and the second modulation signal may correspond to the first voltage controlled oscillator and the first voltage controlled oscillator, respectively.

S22, controlling the voltage controlled oscillator to spectrum spread the clock signal through the modulation signal.

In some exemplary embodiments, after the voltage controlled oscillator corresponding to the modulation signal is determined, the first modulation signal and the second modulation signal are respectively taken as excitation signals of the first voltage controlled oscillator and the second voltage controlled oscillator, the first clock signal and the second clock signal are respectively taken as input signals of the first voltage controlled oscillator and the second voltage controlled oscillator, then the first voltage controlled oscillator and the second voltage controlled oscillator are controlled to spectrum spread the first clock signal upwards and spread the second clock signal downwards, respectively.

Figure 3:
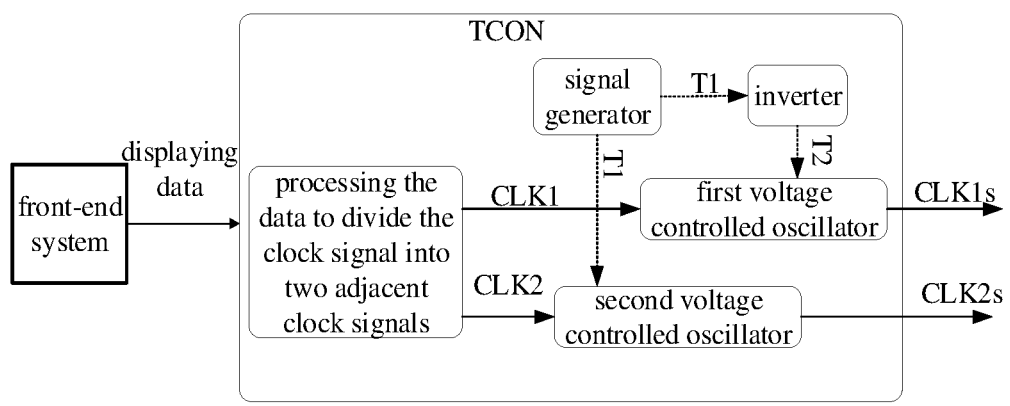
FIG. 3 is a schematic diagram of a signaling process in TCON according to the present disclosure.

As shown in FIG. 3, CLK1 and CLK2 are regarded as the first clock signal and the second clock signal, respectively. T1 and T2 are regarded as the output signals of the signal generator and the inverter, respectively. T1 and T2 are opposite in phase. The specific signaling process includes:

1. sending, by front-end system, the displaying data to TCON;

2. determining, by TCON, the clock signal according to the displaying data, and generating two adjacent clock signals CLK1 and CLK2;

3. taking CLK1 and CLK2 as input signals of the first voltage controlled oscillator and the second voltage controlled oscillator respectively;

4. taking the output signal T1 of the signal generator and the output signal T2 of the inverter as excitation signals of the first voltage controlled oscillator and the second voltage controlled oscillator respectively, in other words, as the modulation signals corresponding to the clock signals CLK1 and CLK2, respectively.

5. spectrum spreading CLK1 upwards and spreading CLK2 downwards by the first voltage controlled oscillator and the second voltage controlled oscillator, respectively, and then outputting spectrum spread CLK1s and CLK2s.

It should be noted that the signal generator is a triangular wave generator, therefore, T1 and T2 are triangular wave signal and reverse triangular wave signal, respectively.

Optionally, after S20, the method further includes:

S80, outputting the spectrum spread two adjacent clock signals.

In some exemplary embodiments, the first clock signal CLK1 and the second clock signal CLK2 are spread to generate the spread clock signals CLK1s and CLK2s. TCON outputs CLK1s and CLK2s, and CLK1s and CLK2s are configured to control the data drive chip and the gate drive chip respectively.

In some exemplary embodiments, two modulation signals which are opposite in phrase are configured to control two independent voltage controlled oscillators to spectrum spread two adjacent clock signals reversely, as such the spectrum range of the clock signals are increased, while the distortion degree of the signals is unchanged, thus further controlling the electromagnetic interference generated by the clock signals.

In addition, the exemplary embodiment of the present disclosure further provides a chip, the chip includes: a signal generator, a voltage controlled oscillator, an inverter, a memory, a processor, and a spread spectrum program stored on the memory and executable on the processor, the spread spectrum program when executed by the processor performs the operations of the method for spreading spectrum as described in above exemplary embodiments.

In addition, the exemplary embodiment of the present disclosure further provides a display panel which includes a chip as described above, the chip includes: a signal generator, a voltage controlled oscillator, an inverter, a memory, a processor, and a spread spectrum program stored on the memory and executable on the processor, the spread spectrum program when executed by the processor performs the operations of the method for spreading spectrum as described in above exemplary embodiments.

In addition, the exemplary embodiment of the present disclosure further provides a computer readable storage medium. The computer readable storage medium stores a spread spectrum program, the spread spectrum program when executed by the processor performs the operations of the method for spreading spectrum as described in above exemplary embodiments.

It needs to be noted that in the present disclosure, the terms "comprising", "including" or other variants arm to cover non-exclusive inclusion, such that the processes, methods, articles or devices including a series of factors not only include these factors, but also include other factors not listed explicitly, or further comprise include intrinsic for such processes, methods, articles or devices. In the absence of more limitations, the factors limited by "comprising a" do not exclude that additional identical factors are also included in the processes, methods, articles or devices including said factors.

Through above description of the embodiments, it should be understood by a person skilled in the art that the present disclosure may be implemented by means of software in connection with necessary universal hardware platform. Of course, the present disclosure may also be implemented by a hardware. However, in many cases the former is more preferred. Based on this understanding, all or the part contributing to the prior art of the technical solution of the present disclosure may be embodied in the form of software. The computer software may be stored in a storage medium (such as ROM/RAM, diskette, or light disk) and include a plurality of instructions which are used to implement the method as described in the various embodiments of the present disclosure by a terminal device (such as a timing controller (TCON), etc.).

The foregoing description merely depicts some embodiments of the present application and therefore is not intended to limit the scope of the present disclosure. An equivalent structural or flow changes made by using the content of the specification and drawings of the present application, or any direct or indirect applications of the disclosure on any other related fields shall all fall in the scope of the application.

What is claimed is:

1. A method for spreading spectrum, comprising:
acquiring a modulation signal corresponding to a clock signal, when the clock signal is detected; and
spectrum spreading the clock signal according to the modulation signal, wherein first and second modulation signals respectively corresponding to two adjacent clock signals are opposite in phase,
wherein, prior to the operation of acquiring the modulation signal corresponding to the clock signal, when the clock signal is detected, the method further comprises:
inputting the first modulation signal into an inverter to generate the second modulation signal; and
defining the first modulation signal and the second modulation signal as the modulation signal for each respective clock signal.

2. The method according to claim 1, wherein prior to the operation of inputting the first modulation signal into the inverter to generate the second modulation signal, the method further comprises:
acquiring and taking an output signal of a signal generator as the first modulation signal.

3. The method according to claim 2, wherein the first modulation signal is a triangular wave signal and the signal generator is a triangular wave generator.

4. The method according to claim 1, wherein the operation of spectrum spreading the clock signal according to the modulation signal comprises:
acquiring a voltage controlled oscillator corresponding to the modulation signal; and
controlling the voltage controlled oscillator to spectrum spread the clock signal through the modulation signal.

5. The method according to claim 4, wherein the voltage controlled oscillator comprises a first voltage controlled oscillator and a second voltage controlled oscillator.

6. The method according to claim 5, wherein the operation of controlling the voltage controlled oscillator to spectrum spread the clock signal through the modulation signal comprises:
defining the first modulation signal and the second modulation signal as excitation signal of the first voltage controlled oscillator and the second voltage controlled oscillator, respectively;
defining the two adjacent clock signals as input signals of the first voltage controlled oscillator and the second voltage controlled oscillator, respectively; and
spectrum spreading the two adjacent clock signals by the first voltage controlled oscillator and the second voltage controlled oscillator, respectively.

7. The method according to claim 1, wherein prior to the operation of spectrum spreading the clock signal according to the modulation signal, the method further comprises:
acquiring displaying data, and obtaining a display clock signal according to the data; and
generating the two adjacent clock signals according to the display clock signal.

8. The method according to claim 7, wherein the displaying data is sent by a front-end system.

9. The method according to claim 7, wherein the two adjacent clock signals are set as a clock signal of a gate driving chip and a clock signal of a data driving chip, respectively.

10. The method according to claim 1, wherein after the operation of spectrum spreading the clock signal according to the modulation signal, the method further comprises:
outputting the spectrum spread two adjacent clock signals.

11. The method according to claim 10, wherein, the operation of outputting the spectrum spread two adjacent clock signals, comprises:
outputting the spectrum spread two adjacent clock signals to the gate driving chip and the data driving chip, to enable the gate driving chip and the data driving chip to set the spectrum spread two adjacent clock signals as an operation clock signal, respectively.

12. A chip, comprising: a signal generator, at least two voltage controlled oscillators, an inverter, a memory, a processor, and a spread spectrum program stored on the memory and executable on the processor, the spread spectrum program when executed by the processor performing the following operations:
acquiring a modulation signal corresponding to a clock signal, when the clock signal is detected; and
spectrum spreading the clock signal according to the modulation signal, wherein modulation signals respectively corresponding to two adjacent clock signals are opposite in phase.

13. The chip according to claim 12, wherein the chip is a timing controller.

14. The chip according to claim 12, wherein the at least two voltage controlled oscillators are set as spread spectrum oscillators for spectrum spreading the clock signal.

15. The chip according to claim 12, wherein an output signal of the signal generator is set as an excitation signal of the at least two voltage controlled oscillators.

16. A display panel, comprising a chip, wherein the chip comprises: a signal generator, at least two voltage controlled oscillators, an inverter, a memory, a processor, and a spread spectrum program stored on the memory and executable on the processor, and the spread spectrum program when executed by the processor performs the following operations:
acquiring a modulation signal corresponding to a clock signal, when the clock signal is detected; and
spectrum spreading the clock signal according to the modulation signal, wherein modulation signals respectively corresponding to two adjacent clock signals are opposite in phase.

17. The display panel according to claim 16, wherein the display panel is a liquid crystal display panel.

18. The display panel according to claim 16, wherein the display panel is a liquid crystal television.

* * * * *